(12) United States Patent
Kushnir et al.

(10) Patent No.: US 9,853,646 B2
(45) Date of Patent: Dec. 26, 2017

(54) SYSTEM, METHOD AND APPARATUS FOR PHASE HITS AND MICROPHONICS CANCELLATION

(71) Applicant: Maxlinear Asia Singapore PTE LTD, Singapore (SG)

(72) Inventors: Igal Yehuda Kushnir, Azur (IL); Ido Mordechai Bettesh, Zichron Yaa'kov (IL); Yaacov Sturkovich, Netanya (IL)

(73) Assignee: Maxlinear Asia Singapore PTE LTD, Singapore (SG)

( * ) Notice: Subject to any disclaimer, the term of this patent is extended or adjusted under 35 U.S.C. 154(b) by 0 days.

(21) Appl. No.: 14/614,792

(22) Filed: Feb. 5, 2015

(65) Prior Publication Data

US 2016/0204909 A1 Jul. 14, 2016

Related U.S. Application Data

(60) Provisional application No. 62/101,184, filed on Jan. 8, 2015.

(51) Int. Cl.
*H04L 5/00* (2006.01)
*H03L 7/00* (2006.01)

(52) U.S. Cl.
CPC ..................................... *H03L 7/00* (2013.01)

(58) Field of Classification Search
CPC .. H03L 7/00; H03L 7/093; H03L 7/10; H04B 1/04; H04B 1/10; H04B 1/16; H04B 7/00; H04L 1/00; H04L 5/0003; H04L 5/14; H04L 12/26

USPC ...... 370/216, 232; 375/222, 285; 455/114.3, 455/118, 507
See application file for complete search history.

(56) References Cited

U.S. PATENT DOCUMENTS

| | | | | |
|---|---|---|---|---|
| 5,872,486 A | * | 2/1999 | Wagner | H03L 7/185 327/107 |
| 2002/0008588 A1 | * | 1/2002 | Khan | G06F 1/0328 331/18 |
| 2002/0163396 A1 | * | 11/2002 | Lim | H01L 23/66 331/179 |
| 2006/0279368 A1 | * | 12/2006 | Rohde | H03B 5/1841 331/167 |
| 2007/0080852 A1 | * | 4/2007 | Blumke | G01S 7/35 342/103 |
| 2008/0002581 A1 | * | 1/2008 | Gorsetman | H04L 1/0003 370/232 |
| 2008/0090531 A1 | * | 4/2008 | Jungerman | H04L 27/364 455/126 |
| 2008/0287076 A1 | * | 11/2008 | Shen | H04B 1/0475 455/114.3 |
| 2010/0277360 A1 | * | 11/2010 | Lee | G01S 5/0289 342/125 |
| 2011/0193572 A1 | * | 8/2011 | Gehrig | B65H 63/064 324/681 |

(Continued)

*Primary Examiner* — Shawkat M Ali
(74) *Attorney, Agent, or Firm* — McAndrews, Held & Malloy, Ltd.

(57) ABSTRACT

A system and method for system, method and apparatus for phase hits and microphonics cancellation. In addition to a first RF synthesizer source, a device also includes a second stable reference signal source that operates at a lower frequency as compared to the RF synthesizer source. The second stable reference signal source is selected with good phase noise characteristics and can be used to correct phase error events.

19 Claims, 7 Drawing Sheets

(56) References Cited

U.S. PATENT DOCUMENTS

| | | | | |
|---|---|---|---|---|
| 2012/0083304 A1* | 4/2012 | Yang | .................. | H03J 1/005 |
| | | | | 455/507 |
| 2012/0220246 A1* | 8/2012 | Kushnir | .................. | H04B 1/04 |
| | | | | 455/118 |
| 2013/0128936 A1* | 5/2013 | Kennard | .................. | H04L 5/14 |
| | | | | 375/222 |
| 2013/0135986 A1* | 5/2013 | Sturkovich | .................. | H04L 5/143 |
| | | | | 370/216 |
| 2014/0191815 A1* | 7/2014 | Mirzaei | .................. | H03L 7/085 |
| | | | | 331/1 A |
| 2015/0004919 A1* | 1/2015 | Ek | .................. | H03L 7/087 |
| | | | | 455/75 |
| 2015/0311908 A1* | 10/2015 | Laaja | .................. | H03L 7/093 |
| | | | | 327/159 |
| 2015/0351635 A1* | 12/2015 | Cerussi | .................. | A61B 5/0075 |
| | | | | 600/477 |

* cited by examiner

SYSTEM, METHOD AND APPARATUS FOR PHASE HITS AND MICROPHONICS CANCELLATION

This application claims the benefit of and priority to provisional application No. 62/101,184, filed Jan. 8, 2015, which is incorporated herein by reference in its entirety.

BACKGROUND

Field

The present disclosure relates generally to microwave backhaul architecture, including a system, method and apparatus for phase hits and microphonics cancellation.

Introduction

Conventional microwave backhaul architectures are generally implemented as either a split outdoor unit (split ODU) configuration or an all outdoor unit (all ODU) configuration. Conventional split ODU configurations are generally comprised of both an indoor unit (IDU) and an outdoor unit (ODU), where the IDU and the ODU are connected over a single channel coaxial interconnect. The IDU in a conventional split ODU configuration typically includes a modem, a digital-to-analog converter and a baseband-to-intermediate frequency converter.

Mobile backhaul providers are experiencing a growing demand for increased capacity as well as a shift from voice services to data services. These factors are driving mobile backhaul networks towards high capacity IP/Ethernet connections. Additionally, the transition to 4G and LTE networks is also driving the need for higher capacity, and moving more packet traffic onto mobile backhaul networks.

BRIEF DESCRIPTION OF THE DRAWINGS

In order to describe the manner in which the above-recited and other advantages and features can be obtained, a more particular description will be rendered by reference to specific embodiments thereof which are illustrated in the appended drawings. Understanding that these drawings depict only typical embodiments and are not therefore to be considered limiting of its scope, the disclosure describes and explains with additional specificity and detail through the use of the accompanying drawings in which.

DETAILED DESCRIPTION

Various embodiments are discussed in detail below. While specific implementations are discussed, it should be understood that this is done for illustration purposes only. A person skilled in the relevant art will recognize that other components and configurations may be used without parting from the spirit and scope of the present disclosure.

Figure 1:
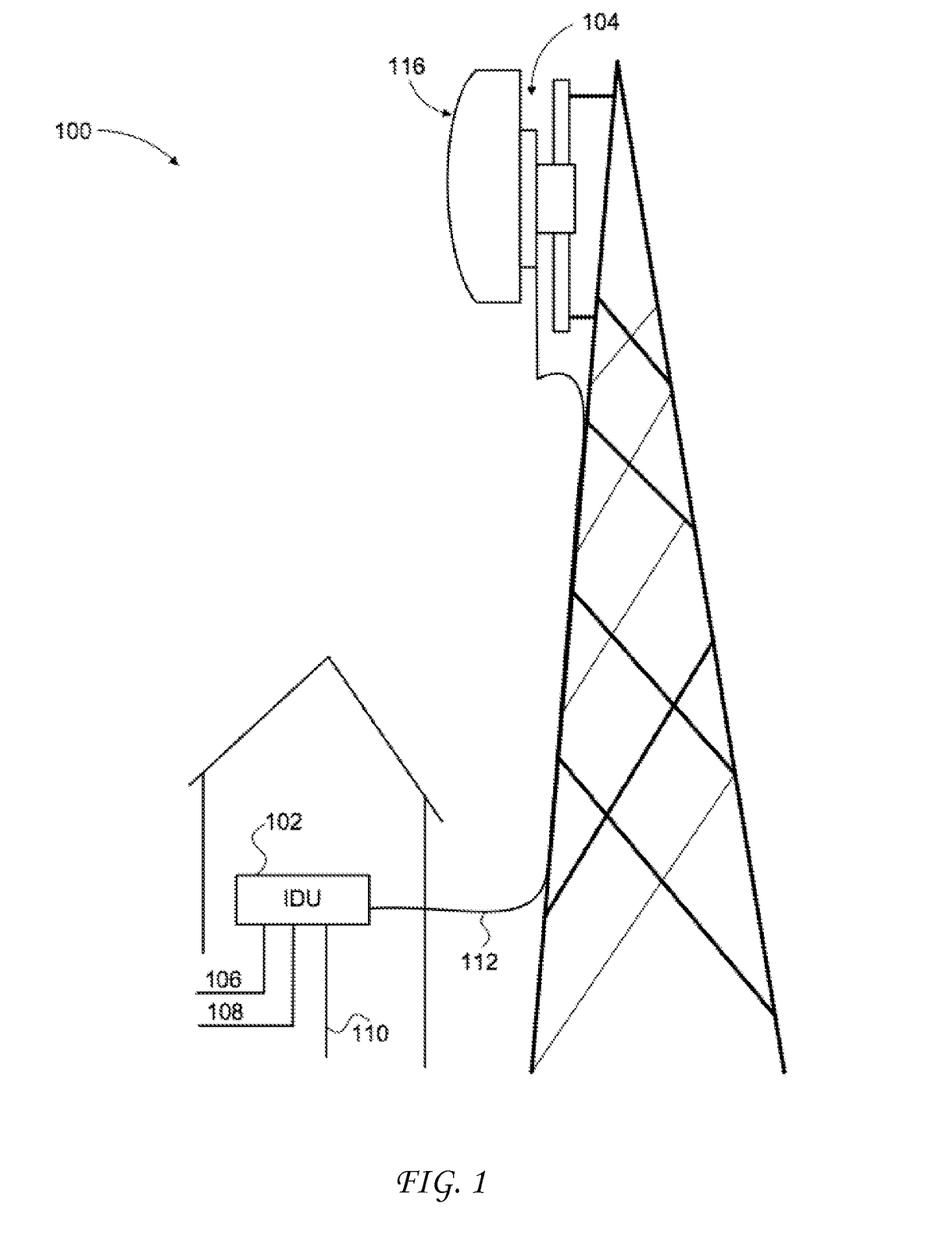
FIG. 1 illustrates a block diagram of a microwave backhaul system according to an exemplary embodiment.

It is recognized that the microwave backhaul world is growing due to increased bandwidth demands. FIG. 1 illustrates a block diagram of an example microwave backhaul system 100 that includes IDU 102 and ODU 104. Microwave, as used throughout this disclosure, refers to both terrestrial point-to-point (PtP) radio communications, as well as point-to-multipoint communications, and can include both wired and/or wireless communications.

Microwave backhaul system 100 initiates communication by accessing an information source, which can comprise, for example, audio data 106, video data 108, or any other data capable of being transmitted over an Internet Protocol (IP)/Ethernet connection 110. To facilitate this communication, IDU 102 can be coupled to a core network. In particular, IDU 102 can be configured to acquire one or more sequences of digital data (e.g., audio data 106, video data 108, data transmitted over IP/Ethernet connection 110, or the like) from the core network. IDU 102 can also be configured to support several additional services, such as Ethernet, time-division multiplexing (TDM), and control data that is aggregated over a radio link.

IDU 102 can be implemented at a location that is substantially removed from ODU 104, such as at a location at ground level. For example, IDU 102 can be positioned inside of a home or an office building, or other structure. Conversely, ODU 104 can be implemented at a substantially elevated location, such as on top of a pole, on top of an antenna tower, on top of a building, or other mounted location. In some embodiments, IDU 102 and ODU 104 can be separated by a significant distance (e.g., up to approximately 300 meters). In general, IDU 102 includes a modem assembly, while ODU 104 includes at least some RF functionalities as well as corresponding digital capabilities.

IDU 102 and ODU 104 can be connected via communication pathway 112, which can be configured such that data can be transmitted between IDU 102 and ODU 104. In various examples, communication pathway 112 can comprise a twisted pair Ethernet cable, a fiber optic cable, a coaxial cable, an intermediate frequency (IF) cable, or any other cable suitable for IDU-ODU communication. Therefore, depending on a chosen communication medium, communication pathway 112 can facilitate transmission of an analog signal or a digital signal between IDU 102 and ODU 104. In some embodiments, communication pathway 112 can be a wireless communication channel.

Antenna 116 can be coupled to ODU 104, and can be positioned close to ODU 104. Therefore, microwave backhaul system 100 can be implemented such that data can be transmitted from IDU 102, across communication pathway 112, to ODU 104, and subsequently to antenna 116 where communication over a wireless link can then be initiated. Also, microwave backhaul system 100 can be implemented such that data received by antenna 116 can be transmitted from ODU 104 over communication pathway 112 to IDU 102.

Figure 2A:
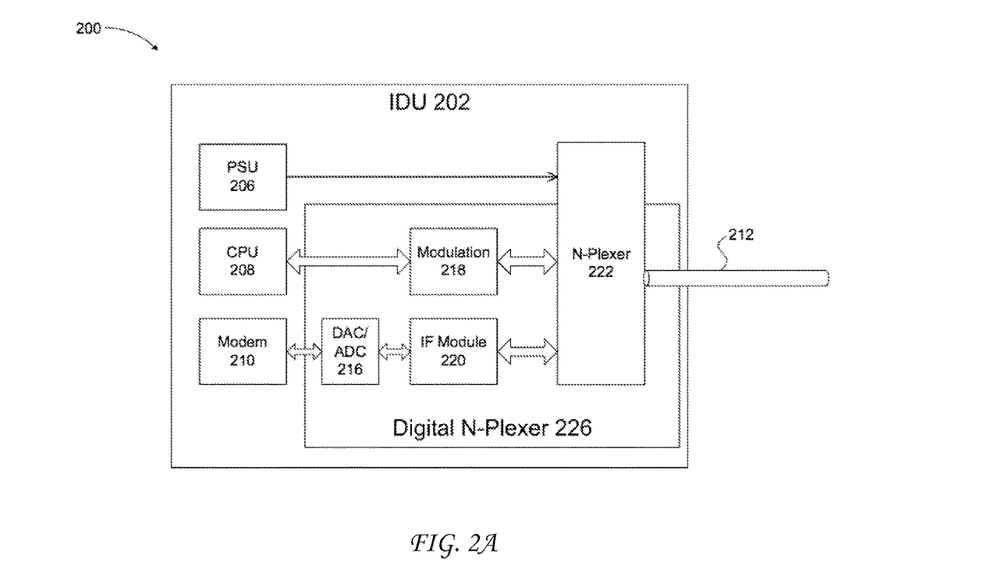
FIG. 2A illustrates a high-level block diagram of an IDU for implementation within a microwave backhaul system according to an exemplary embodiment.
Figure 2B:
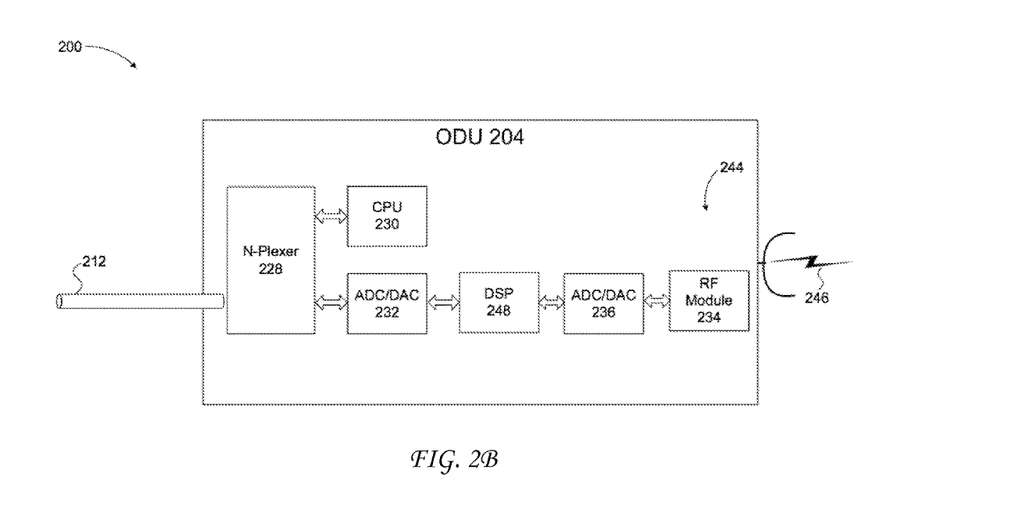
FIG. 2B illustrates a high-level block diagram of an ODU for implementation within a microwave backhaul system according to an exemplary embodiment.

In one embodiment, ODU 104 can correct errors associated with a signal received over a wireless link via antenna 116. Microwave backhaul system 100 can also be configured to support adaptive coding and modulation (ACM), which provides high reliability of microwave backhaul system 100 even in extreme weather, such as wind, rain, hail, or other interfering environmental conditions. For example, ACM can adapt coding and modulation rates to changing environmental conditions to thereby increase throughput over a link and make efficient use of the existing spectrum. Thus, ACM enables the ODU to hitlessly manage the transitions when adjusting the number of transmission/receipt channels based on the changes in the communication channel FIGS. 2A and 2B illustrate high-level block diagrams of an example IDU and ODU, respectively, for use within a microwave backhaul system according to an exemplary embodiment. IDU 202 and ODU 204 are coupled together via communication pathway 212. IDU 202 can represent an exemplary embodiment of IDU 102 of FIG. 1, and ODU 204 can represent an exemplary embodiment of ODU 104 of FIG. 1.

IDU 202 includes a power supply unit (PSU) 206, a CPU 208, a modem assembly 210, a digital-to-analog converter/analog-to-digital converter (DAC/ADC) block 216, a modulation block 218, and an intermediate frequency (IF) module 220. In some embodiments, IDU 202 can also include an N-Plexer 222. CPU 208 is configured to carry out instructions to perform arithmetical, logical, and/or input/output (I/O) operations of one or more of the aforementioned elements contained within IDU 202. In an embodiment, CPU 208 can control operation of modulation block 218 and N-Plexer 222.

Modem assembly 210 is configured to perform modulation and demodulation of data that is to be transmitted between IDU 202 and ODU 204. In some embodiments, modem assembly 210 can function substantially similar to a baseband modem. Further, modem assembly 210 can be configured to cancel out noise associated with IDU 202 or communication pathway 212. DAC/ADC block 216 can be configured to transmit and/or receive data from modem assembly 210. DAC/ADC block 216 is also configured to perform digital-to-analog and/or analog-to-digital conversions of data such that the data is suitable for transmission over communication pathway 212.

Modulation block 218 can also be configured to perform various modulation and/or demodulation techniques. In an embodiment, modulation block 218 can be configured to perform amplitude-shift keying. For example, modulation block 218 can be configured to perform amplitude-shift keying by utilizing a finite number of amplitudes, where each amplitude is assigned a unique pattern of binary digits. Each pattern can then be configured to form the specific symbol that is represented by the particular amplitude. Additionally, when modulation block 218 is configured to perform demodulation, modulation block 218 determines the amplitude of the received signal and maps it back to the symbol it represents, thus recovering the original data.

IF module 220 can be configured to transmit and/or receive data from DAC/ADC block 216. IF module 220 is also configured to perform a frequency conversion of the received data such that data is suitable for transmission over communication pathway 212. For example, IF module 220 can be configured to convert data from a baseband frequency to an IF.

N-Plexer 222 can be configured to permit N-directional communication over communication pathway 212. In particular, N-Plexer 222 is configured to isolate IDU 202 from ODU 204, while permitting them to share a common antenna. N-Plexer 222 is also configured to receive a control signal (e.g. a Telemetry ASK signal) output from modulation block 218, and to receive an IF signal output from IF module 220. Additionally, N-Plexer 222 can be configured to convert and/or combine each of these inputs to form data. N-Plexer 222 is also configured to transmit and/or receive data, over communication pathway 212, between IDU 202 and ODU 204. In an embodiment, N-Plexer 222 can function substantially as an analog duplexer (multiplexer/demultiplexer). In one embodiment, communication pathway 212 can be embodied as one or more IF cables that can facilitate quadruple channel communication with one or more IDUs.

In an exemplary embodiment, DAC/ADC block 216, modulation block 218, IF module 220 and N-Plexer 222 can be replaced by Digital N-Plexer 226. In particular, Digital N-Plexer 226 can be configured to multiplex/demultiplex the required signal in the digital domain, rather than in the analog domain. Subsequently, Digital N-Plexer 226 can allow communication pathway 212 to be implemented as either a digital pathway or an analog pathway. Using Digital N-Plexer 226 allows for a simpler implementation of IDU 202. For example, when implementing IDU 202 having Digital N-Plexer 226, no analog functionality would be required, and instead only a single digital chip substrate would be needed. As a result, the cost of implementing IDU 202 can be decreased. Additionally, using a Digital N-Plexer 226 can provide an improved yield, shorter production testing, lower assembly cost, lower peripheral component count, and can support greater distances between IDU 202 and ODU 204, to provide some examples.

As illustrated in FIG. 2B, ODU 204 can also include an N-Plexer 228, which can be implemented in several different manners. For example, N-Plexer 228 can be an analog N-Plexer, a digital N-Plexer, or a split function N-Plexer (e.g., where N-Plexer 228 is partially analog and partially digital). When N-Plexer 228 represents a digital N-Plexer, N-Plexer 228 can function in a substantially similar manner as Digital N-Plexer 226. In particular, N-Plexer 228 can be configured to multiplex/demultiplex signals in the digital domain. N-Plexer 228 also allows for a simpler implementation of ODU 204 because no analog functionality would be required, and instead only a single digital chip substrate would need to be implemented within ODU 204. Therefore, the cost of implementing ODU 204 can also be decreased. Similar to Digital N-Plexer 226, implementing N-Plexer 228 within ODU 204 can provide an improved yield, shorter production testing, lower assembly cost, lower peripheral component count, and can support greater distances between IDU 202 and ODU 204, to provide some examples.

In an embodiment, IDU 202 and ODU 204 can be configured to perform an N-Plexer elimination technique. In particular, the functionality directed towards filtering RX signals, after being received over communication pathway 212, and TX signals, before being transmitted over communication pathway 212, can be removed from N-Plexers 226 and 228. Instead, this functionality can be implemented within the digital chip substrate (e.g., integrated circuit) that comprises IDU 202 and the digital chip substrate (e.g., integrated circuit) that comprises ODU 204. IDU 202 and ODU 204 can then filter the required signals through any combination of an analog filtering process, a signal sampling process and/or a digital filtering process.

ODU 204 can also include CPU 230, ADC/DAC blocks 232 and 236, digital signal processor (DSP) 248, and RF module 234. CPU 230 can be configured to function in a substantially similar manner as CPU 208. In particular, CPU 230 can be configured to carry out instructions to perform arithmetical, logical, and/or I/O operations of one or more of the elements contained within ODU 204. In an embodiment, CPU 208 can control operation of N-Plexer 228. ADC/DAC block 232 can be configured to transmit and/or receive data from N-Plexer 228. ADC/DAC blocks 232 and 236 are also configured to perform analog-to-digital and/or digital-to-analog conversions of data such that data can be properly transmitted and/or received over communication pathway 212. Further, DSP 248 can be configured to perform mathematical manipulation techniques on data, such that data may be modified or improved according to a desired processing method. For example, DSP 248 can be configured to measure, filter, or compress data prior to being output to ADC/DAC block 236, such that error detection and/or error correction can be performed on the data. In an embodiment, after the data is received, over communication pathway 212, at ODU 204, the data traverses through N-Plexer 228, to ADC/DAC block 232, to DSP 248, to ADC/DAC block 236, to RF module 234 and to antenna 244 before being transmitted across wireless link 246. Similarly, after data is received over wireless link 246, at ODU 204, data traverses from antenna 244 to RF module 234, to ADC/DAC block 236, to DSP 248, to ADC/DAC block 232, and to N-Plexer 228 before being transmitted over communication pathway 212. As will be described in greater detail below, DSP 248 can also be configured to implement a phase hits and microphonics cancellation mechanism.

RF module 234 can be configured to transmit and/or receive data from ADC/DAC block 236. RF module 234 can also be configured to perform a frequency conversion of data such that data can be properly received over communication pathway 212. For example, when data is received at RF module 234, data can have a frequency residing in the IF range. Therefore, RF module 234 can up-convert data from an IF to a RF such that data can then be transmitted over wireless link 246. RF module 234 can also be configured to down-convert a signal received over the wireless link from a RF to an IF such that the received signal can be transmitted over communication pathway 212 to IDU 202.

As noted, there is a continuing need for higher capacity systems using higher levels of modulation. For example, work is ongoing to extend the capacity afforded by 4096 quadrature amplitude modulation (QAM) systems to higher capacity systems using 16,384 QAM. Additional capacity growth can also be enabled using more complex systems that leverage cross polarization and 4×4 spatial multiple-input-multiple-output (MIMO) systems.

In the present disclosure, it is recognized that phase hits and microphonics is a major impediment to the development of high modulation and MIMO systems. These systems are sensitive to phase hits under 1 kHz. When microwave local oscillator (LO) frequencies are in the range of 6 GHz to 43 GHz, phase hits and microphonics makes it nearly impossible to reach zero bit error rate (BER) performance in high modulation and MIMO systems.

Figure 3:
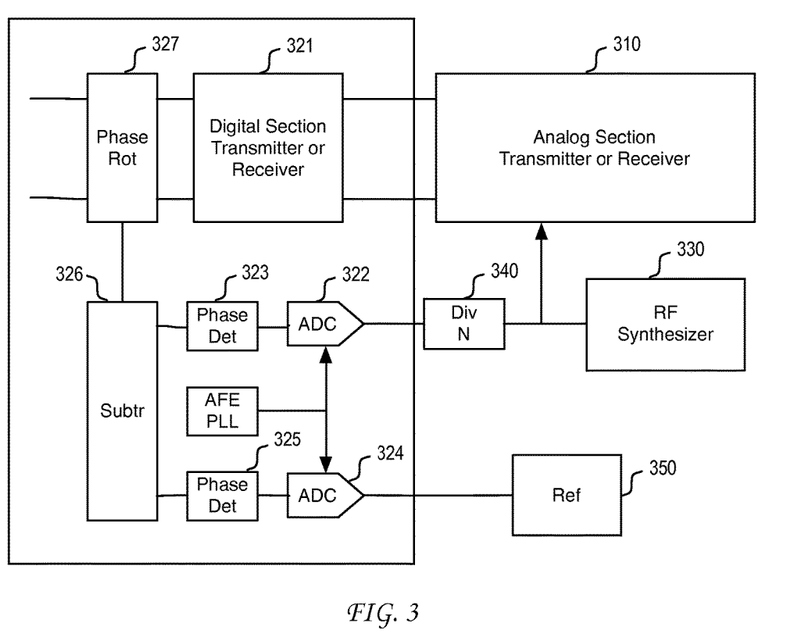
FIG. 3 illustrates an example of a mechanism for correcting phase error events.

The present disclosure presents a mechanism for phase hits and microphonics cancellation that can be used to enable high modulation and MIMO systems. FIG. 3 illustrates an example of a mechanism for correcting phase error events. As illustrated, the microwave device includes an analog transmitter or receiver section 310 that is configured to operate based on a LO signal generated by RF synthesizer 330. The signal generated by RF synthesizer 330 can be characterized as $S_{LO}(t)=A_{LO}\cos(\omega_{LO} \cdot t+\varphi_{LO}(t))$. As would be appreciated, the frequency of the LO signal (e.g., 8 GHz) can vary depending on the implementation and application.

As further illustrated in FIG. 3, the microwave device also includes a second signal reference 350. In the present disclosure, it is recognized that signal reference 350 can be established at a significantly lower frequency (e.g., 800 MHz) as compared to RF synthesizer 330 and can therefore be implemented as a stable reference with very good phase noise characteristics. In one example, signal reference 350 can be embodied as a voltage controlled oscillator (VCO) that has a very high Q and is not necessarily frequency locked. In other examples, signal reference 350 can be free running from any clock source such as a temperature-controlled crystal oscillator (TCXO), ceramic resonator oscillator (CRO), surface acoustic wave (SAW) resonator, or any other stable reference source that does not suffer from phase hits. In yet another example, a VCO can be placed physically in a so called "protected" environment where both temperature and voltage are well monitored. Here, it should be recognized that optimal voltage and temperature conditions can be achieved in the IDU.

The signal generated by signal reference 350 can be characterized as $S_{REF}(t)=A_{REF}\cos(\omega_{REF} \cdot t+\varphi_{REF}(t))$. As would be appreciated, the particular frequency of operation of signal reference 350 can vary and can be selected to enable phase cancellation relative to a divided RF synthesizer 330 signal.

In the example of FIG. 3, the signal output by RF synthesizer 330 is divided by a factor N by divider 340. In one example, divider 340 can divide an 8 GHz signal output by RF synthesizer 330 by a factor of 10 to produce an 800 MHz signal. In one example, signal reference 350 can be selected to generate an 800 MHz signal.

The signal output by divider 340 is provided as an input to analog-to-digital converter (ADC) 322 in a digital core of the microwave device. Similarly, the signal output by signal reference 350 is provided as an input to ADC 324 in the digital core of the microwave device. Phase detector 323 is configured to detect the phase in the digital signal representative of the divided LO signal generated by RF synthesizer 330. Similarly, phase detector 325 is configured to detect the phase in the digital signal representative of the signal generated by signal reference 350.

The phase of the divided LO signal as determined by phase detector 323 can be subtracted from the phase of the reference signal as determined by phase detector 324 using subtraction module 326. This comparison by subtraction module 326 of the phases of the divided LO signal and the reference signal enables a determination of a phase error of RF synthesizer 330 in comparison to signal reference 350. Subtraction module 326 can then generate a phase correction signal, which can be represented as $S_{phase\_corr}[n] \cong N \cdot \varphi_{REF}[n] - \varphi_{LO}[n-\tau]$. As illustrated, a phase correction signal output by subtraction module 326 is applied to phase rotation module 327, which performs a rotation on the data path to correct the phase error events. Here, it is recognized in the present disclosure that as long as signal reference 350 is a stable signal source, the device can achieve phase hits and microphonics immunity.

Figure 4:
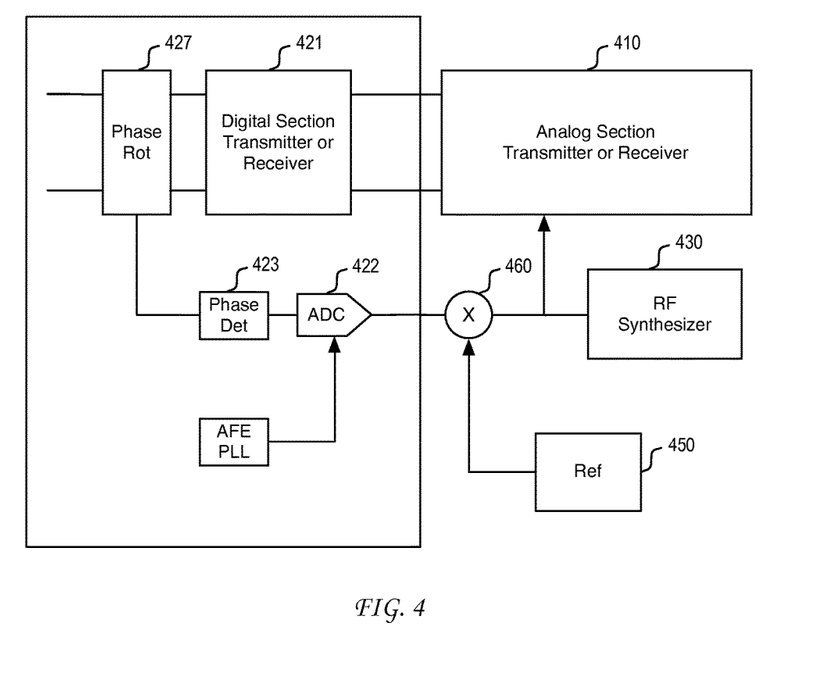
FIG. 4 illustrates another example of a mechanism for correcting phase error events.

The example of FIG. 3 provides a phase hits and microphonics cancellation mechanism using differential sampling of a LO signal and a reference signal. In another example, a phase hits and microphonics cancellation mechanism is enabled by mixing of two products, wherein a first product is sourced from an RF synthesizer and a second product is sourced from a signal reference. FIG. 4 illustrates this other example mechanism for correcting phase error events.

As illustrated, the microwave device includes an analog transmitter or receiver section 410 that is configured to operate based on a LO signal generated by RF synthesizer 430. The signal generated by RF synthesizer 430 can be characterized as $S_{LO}(t)=A_{LO}\cos(\omega_{LO} \cdot t+\varphi_{LO}(t))$. As would be appreciated again, the frequency of the LO signal (e.g., 8 GHz) can vary depending on the implementation and application.

As further illustrated in FIG. 4, the microwave device also includes a second signal reference 450. Again, it is recognized in the present disclosure that signal reference 450 can be established at a significantly lower frequency (e.g., 800 MHz) as compared to RF synthesizer 430 and can therefore be implemented as a stable reference with very good phase noise similar to RF synthesizer 330. The signal generated by signal reference 450 can be characterized as $S_{REF}(t)=A_{REF} \cos(\omega_{REF} \cdot t + \varphi_{REF}(t))$. As would be appreciated, the particular frequency of operation of signal reference 450 can vary and can be selected to enable phase cancellation relative to a divided RF synthesizer 430 signal.

In the example of FIG. 4, a signal sourced from RF synthesizer 430 is mixed with a reference signal sourced from signal reference 450 by mixer 460. The signal output by mixer 460 is provided as an input to ADC 422 in a digital core of the microwave device. Phase detector 423 is then configured to detect the phase error of RF synthesizer 430 relative to signal reference 450. Phase detector 423 can then generate a phase correction signal, which can be represented as $S_{phase\_corr}[n] \cong \varphi_{REF}[n] - \varphi_{LO}[n-\tau]$. The phase correction signal output by phase detector 423 is then applied to phase rotation module 427, which performs a rotation on the data path to correct the phase error events. Here again, it is recognized in the present disclosure that as long as signal reference 350 is a stable signal source, the device can achieve phase hits and microphonics immunity.

Figure 5:
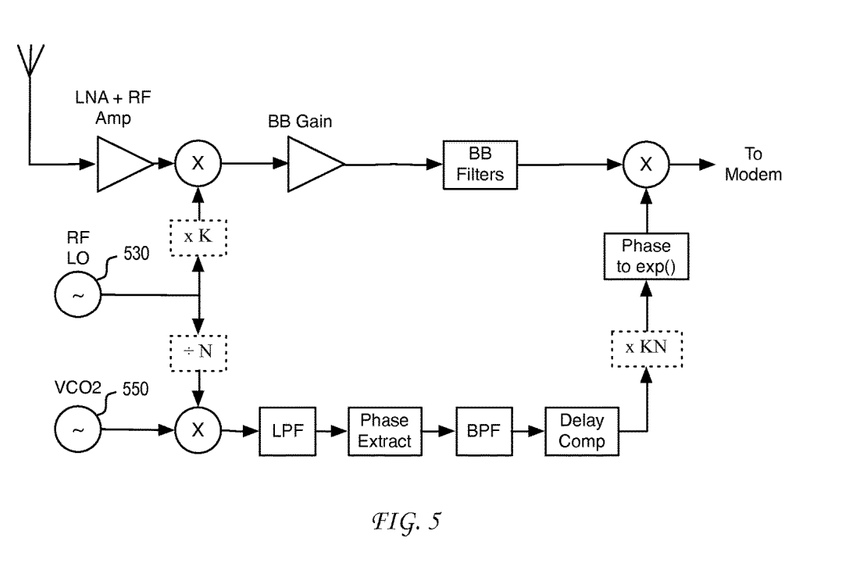
FIG. 5 illustrates an example embodiment of a mechanism for correcting phase error events in a receiver.

FIG. 5 illustrates an example embodiment of a mechanism for correcting phase error events in a receiver using the mixing of two products, wherein a first product is sourced from an RF synthesizer (RF LO) and a second product is sourced from a signal reference (VCO2) established at a significantly lower frequency as compared the RF synthesizer. As illustrated, RF LO 530 generates an LO signal that is used for a down-conversion mixer in a conventional receive chain of a microwave device.

In the illustrated embodiment, the LO signal generated by RF LO 530 is divided by N then mixed with the signal generated by VCO2 550. After both division by N and being further down-converted with the signal generated by VCO2 550, the signal frequency is sufficiently low such that its phase can be extracted. Next, the extracted phase passes through a band pass filter (BPF) having a passband $[F_1 \div F_2]$.

In one embodiment, the high pass filter (HPF) part of the BPF filters out the carrier frequency of the phase. Since the frequency of VCO2 550 is not locked to an arbitrary reference the frequency after the phase extraction is meaningless. In one embodiment, the value of $F_1$ can be set according to the following objectives. First, the $F_1$ minimal value can be sufficiently high to track down the frequency drift of VCO2 550. The frequency drift can be caused mainly by temperature and aging and therefore a few Hz should be sufficient for tracking. Second, the $F_1$ maximal value should be sufficiently low such that the modem phase tracking circuits can cancel the phase in the range $[0 \div F_1]$. For example, assuming that pilots spacing=41 and $F_{sym}$=6 Msym/s the Pilot-Symbol Assisted Modulation (PSAM) can cancel at least 20 kHz.

In one embodiment, the low-pass filter (LPF) part of the BPF limits the corrected phase to low frequencies only since correction in high frequencies is not possible due to very low values of the phase noise and sensitivity to delay mismatches. The corner frequency $F_2$ can be set according to the following objectives. First, the $F_2$ minimal value can be sufficiently high to filter out the phase hits. It is recognized that the required bandwidth can be $1 \div 2$ MHz but the precise value can depend on the phase hit model (if any). Second, the $F_2$ maximal value can be sufficiently low such that cancellation of phase noise is valid for $f < F_2$. As would be appreciated, the precise value can depend on specific system parameters such as the phase noise of RF LO 530, VCO2 550 and the delay resolution.

After the BPF the phase is subtracted from the signal phase. Since the signal phase includes the RF synthesizer phase, subtracting the phase should cancel out the RF synthesizer phase. Mathematically, the phase cancellation looks as follows in equation (1):

$$\phi_{out}(t) = K \cdot \phi_{RFLO}(t) - KN \cdot h_{BPF(t)} * \left( \frac{\phi_{RFLO}(t)}{N} - \phi_{VCO2}(t) \right)$$

Rewriting equation (1) in the frequency domain leads to the following in equation (2):

$$\phi_{out}(f) = K \cdot \phi_{RFLO}(f) - KN \cdot H_{BPF}(f) \left( \frac{\phi_{RFLO}(f)}{N} - \phi_{VCO2}(f) \right)$$
$$= K \cdot \phi_{RFLO}(f)(1 - H_{BPF}(f)) + KN \cdot H_{BPF}(f) \cdot \phi_{VCO2}(f)$$

Summarizing equation (2) it can be seen that the original phase noise (without correction) $K \cdot \varphi_{RFLO}(f)$ is filtered by $1 - H_{BPF}(f)$ which decreases its variance substantially. VCO2 sets a floor on the phase noise variance which emphasizes the importance of choosing VCO2 with a low phase noise. The tradeoff in choosing $H_{BPF}(f)$ can also be deduced from equation (2). Choosing a wide bandwidth for $H_{BPF}(f)$ provides better filtering for $\varphi_{RFLO}(f)$ but increases the contribution of $\varphi_{VCO2}(f)$.

The optional delay in FIG. 5 is used for compensating the processing time of the phase correction branch which can be longer then the main signal chain due to the narrow bandwidth of $H_{BPF}(f)$. Adding additional delay of $\tau$ to equation (2) produces the following in equation (3):

$$\phi_{out}(f) = K \cdot \phi_{RFLO}(f) e^{j2\pi f \tau} - KN \cdot H_{BPF}(f) \left( \frac{\phi_{RFLO}(f)}{N} - \phi_{VCO2}(f) \right)$$
$$= K \cdot \phi_{RFLO}(f)(e^{j2\pi f \tau} - H_{BPF}(f)) +$$
$$KN \cdot H_{BPF}(f) \cdot \phi_{VCO2}(f)$$

Here, the delay $\tau$ can be optimized to produce minimal variance for $\varphi_{OUT}(f)$.

Figure 6:
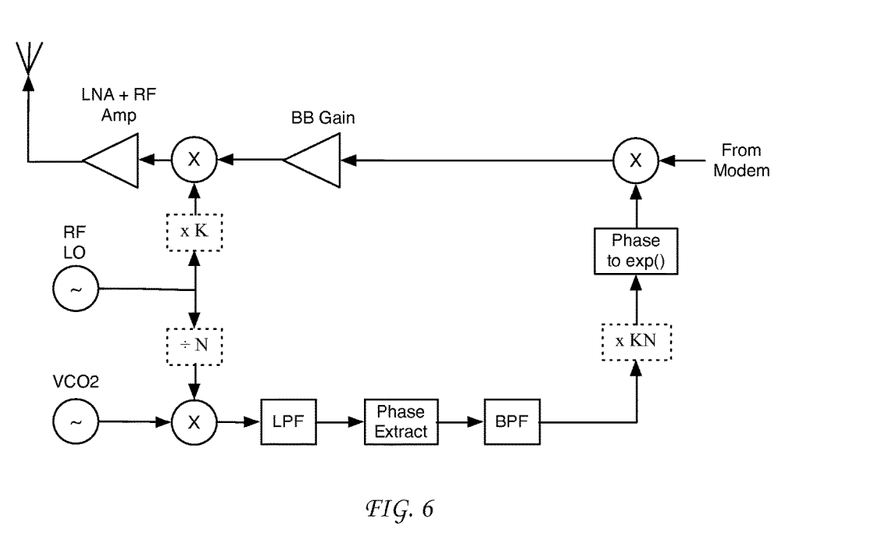
FIG. 6 illustrates an example embodiment of a mechanism for correcting phase error events in a transmitter.

FIG. 6 illustrates an example embodiment of a mechanism for correcting phase error events in a transmitter using the mixing of two products, wherein a first product is sourced from an RF synthesizer (RF LO) and a second product is sourced from a signal reference (VCO2) established at a significantly lower frequency as compared the RF synthesizer. As illustrated, the schematics for the transmitter is similar to the receiver embodiment illustrated in FIG. 5. One difference is that the transmitter cannot compensate for the phase correction branch delay since the correction is always applied with delay relative to the original phase noise. Mathematically, this changes equation (2) into the following in equation (4), where $T_D$ is the delay of the feedback phase correction branch:

$$\phi_{out}(f) = K \cdot \phi_{RFLO}(f) - KN \cdot H_{BPF}(f) \cdot e^{j2\pi f \cdot T_D} \left( \frac{\phi_{RFLO}(f)}{N} - \phi_{VCO2}(f) \right)$$
$$= K \cdot \phi_{RFLO}(f)(1 - e^{j2\pi f \cdot T_D} \cdot H_{BPF}(f)) +$$
$$KN \cdot e^{j2\pi f \cdot T_D} \cdot H_{BPF}(f) \cdot \phi_{VCO2}(f)$$

As has been described, the addition of an additional frequency source having very good phase noise can be used to decrease the phase noise of any LO in a specified bandwidth.

Figure 7:
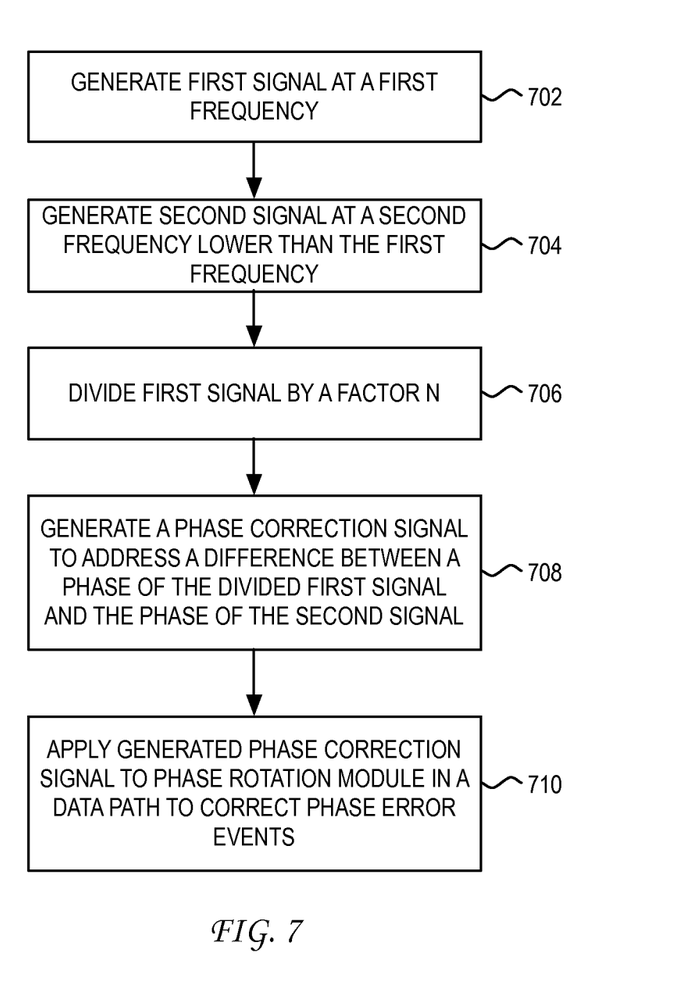
FIG. 7 illustrates a flowchart of an example process.

Having described a framework for phase hits and microphonics cancellation in a device, reference is now made to FIG. 7, which illustrates a flowchart of an example process. As illustrated, the process begins at step 702 where a first signal is generated at a first frequency. In one example, the first signal can be a LO signal generated by an RF synthesizer source for use by a microwave device. At step 704, a second signal is generated by a reference source at a second frequency significantly lower than the first frequency. In one example, the second signal can be generated by a second signal source, which is characterized as a stable reference with very good phase noise characteristics. At step 706, the first signal is then divided by a factor N.

Next, at step 708, a phase correction signal is generated to address a difference between a phase of the divided first signal and the phase of the second signal. In one embodiment, the phase correction signal is based on differential sampling of the divided first signal and the second signal. In another embodiment, the phase correction signal is generated based on a mixing of two products, wherein a first product is sourced from an RF synthesizer and a second product is sourced from the reference source. Finally, at step 710, the phase correction signal is applied to a phase rotation module in a data path to correct phase error events. In one embodiment, the phase correction signal is applied to a phase rotation module in a transmit data path. In another embodiment, the phase correction signal is applied to a phase rotation module in a receive data path.

In one embodiment, the phase hit/noise cancellation mechanism can be performed in the baseband modem. In another embodiment, the phase hit/noise cancellation mechanism can be implemented in a standalone synthesizer without being combined with a baseband modem.

With the phase hit/noise cancellation mechanism, it is expected that systems such as 4096 QAM Zero BER systems, 4096 QAM Zero BER Cross Polarization Cancellation (XPIC) systems, 4096 QAM Zero BER 4×4 MIMO systems, and other higher modulation systems that are sensitive to phase hits and microphonics can be enabled.

Another embodiment of the present disclosure can provide a machine and/or computer readable storage and/or medium, having stored thereon, a machine code and/or a computer program having at least one code section executable by a machine and/or a computer, thereby causing the machine and/or computer to perform the steps as described herein.

Those of skill in the relevant art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Those of skill in the relevant art can implement the described functionality in varying ways for each particular application. Various components and blocks may be arranged differently (e.g., arranged in a different order, or partitioned in a different way) all without departing from the scope of the subject technology.

These and other aspects of the present disclosure will become apparent to those skilled in the relevant art by a review of the preceding detailed disclosure. Although a number of salient features of the present disclosure have been described above, the principles in the present disclosure are capable of other embodiments and of being practiced and carried out in various ways that would be apparent to one of skill in the relevant art after reading the present disclosure, therefore the above disclosure should not be considered to be exclusive of these other embodiments. Also, it is to be understood that the phraseology and terminology employed herein are for the purposes of description and should not be regarded as limiting.

What is claimed is:
1. A device, comprising:
 a first frequency source at a first frequency for use by an analog microwave transmitter or receiver;
 a divider operably coupled to the first frequency source, wherein a ratio of the first frequency to an output frequency of the divider is N, wherein the output frequency is non-zero;
 a second frequency source at a second frequency, the second frequency being lower than the first frequency; and
 a digital signal processor (DSP) operably coupled to the divider and the second frequency source, wherein a phase correction signal output of the DSP is based on a difference between a detected first phase of the output frequency of the divider and a detected second phase of the second frequency, the phase correction signal output for use in a transmit or receive data path to correct a phase error external to the first frequency source and the second frequency source.

2. The device of claim 1, wherein the second frequency is the first frequency divided by N.

3. The device of claim 1, wherein the second frequency source is a ceramic resonator oscillator.

4. The device of claim 1, wherein the second frequency source is a surface acoustic wave resonator.

5. The device of claim 1, wherein the second frequency source is a free running voltage controlled oscillator.

6. The device of claim 1, wherein the second frequency source is a temperature controlled crystal oscillator.

7. A device, comprising:
 a first frequency source at a first frequency for use by an analog microwave transmitter or receiver;
 a divider operably coupled to the first frequency source, wherein a ratio of the first frequency to an output frequency of the divider is N, wherein the output frequency is non-zero;
 a second frequency source at a second frequency, the second frequency being lower than the first frequency;
 a mixer operably coupled to the divider and the second frequency source; and
 a digital signal processor (DSP) operably coupled to the mixer, wherein a phase correction signal output of the DSP is based on a filtering of an output from the mixer, the phase correction signal output for use in a transmit or receive data path to correct a phase error external to the first frequency source and the second frequency source.

8. The device of claim 7, wherein the second frequency is the first frequency divided by N.

9. The device of claim 7, wherein the second frequency source is a ceramic resonator oscillator.

10. The device of claim 7, wherein the second frequency source is a surface acoustic wave resonator.

11. The device of claim 7, wherein the second frequency source is a free running voltage controlled oscillator.

12. The device of claim 7, wherein the second frequency source is a temperature controlled crystal oscillator.

13. A method performed by a microwave device, comprising:

generating, using a first frequency source, a first signal at a first frequency for use by an analog microwave transmitter or receiver in the microwave device;

generating, using a second frequency source, a second signal at a second frequency lower than the first frequency;

dividing the first signal at the first frequency by a factor N to produce a divided first signal, wherein the divided first signal is at a non-zero frequency;

generating a phase correction signal based on a difference between a phase of the divided first signal and a phase of the second signal; and applying the generated phase correction signal to a phase rotation module in a transmit or receive data path to correct a phase error in the microwave device, wherein the first frequency source is independent of the generated phase correction signal, wherein the phase error is external to the first frequency source and the second frequency source.

14. The method of claim 13, wherein the second frequency source is a ceramic resonator oscillator.

15. The method of claim 13, wherein the second frequency source is a surface acoustic wave resonator.

16. The method of claim 13, wherein the second frequency source is a free running voltage controlled oscillator.

17. The method of claim 13, wherein the second frequency source is a temperature controlled crystal oscillator.

18. The method of claim 13, wherein the generating comprises subtracting a phase of the divided first signal from the phase of the second signal.

19. The method of claim 13, wherein the generating comprises mixing the divided first signal with the second signal to produce a mixed output signal, and filtering the mixed output signal.

* * * * *